United States Patent [19]

Martin et al.

[11] Patent Number: 5,783,098
[45] Date of Patent: Jul. 21, 1998

[54] DECAPSULATOR AND METHOD FOR DECAPSULATING PLASTIC ENCAPSULATED DEVICE

[75] Inventors: Kirk Alan Martin, Aptos; Richard A. Kanishak, Danville, both of Calif.

[73] Assignee: Nisene Technology Group, Soquel, Calif.

[21] Appl. No.: 757,495

[22] Filed: Nov. 27, 1996

Related U.S. Application Data

[63] Continuation-in-part of Ser. No. 656,498, May 31, 1996.

[51] Int. Cl.[6] ............................................. B44C 1/22
[52] U.S. Cl. ............................ 216/56; 156/345; 216/92
[58] Field of Search ........................ 156/345 L, 345 LC, 156/637.1, 639.1; 216/38, 56, 90, 92

[56] References Cited

U.S. PATENT DOCUMENTS

| | | | |
|---|---|---|---|
| 4,344,809 | 8/1982 | Wensink | 156/345 |
| 4,359,360 | 11/1982 | Harris et al. | 216/92 X |
| 4,826,556 | 5/1989 | Kobayashi | 216/92 X |
| 5,127,991 | 7/1992 | Lal et al. | 156/659.1 |
| 5,252,179 | 10/1993 | Ellerson et al. | 156/655 |
| 5,271,798 | 12/1993 | Sandhu et al. | 156/638 |

OTHER PUBLICATIONS

Brochure entitled: "B&G Decapsulator", Model 250, B & G International, Soquel, California (6 pages), pre–May 1995.

*Primary Examiner*—William Powell
*Attorney, Agent, or Firm*—Skjerven Morrill MacPherson Franklin & Friel LLP; Thomas S. MacDonald

[57] ABSTRACT

An apparatus and method for selectively etching an encapsulant forming a package of resinous material around an electronic device includes a source of etchant solution and an etching assembly including an etch plate and a movable cover, the etch plate and cover forming an etching chamber. An etch head is supported by the etch plate and the electronic device package is mountable in the chamber on the etch head. In a first mode of operation a displacement pump pumps a first quantity of etchant solution into the etch head and in a second mode of operation the displacement pump agitates at least part of the first quantity of etchant solution repeatedly into and out of an etched cavity formed on an exterior surface of the electronic device package by reaction of the etchant solution with the resinous material. A waste reservoir and a waste outlet extending from the etch head to the reservoir is also provided. The etch head is easily removable from the etch plate by removal of an etch head retainer.

17 Claims, 7 Drawing Sheets

DECAPSULATOR AND METHOD FOR DECAPSULATING PLASTIC ENCAPSULATED DEVICE

RELATED APPLICATIONS

This application is a continuation-in-part application of U.S. Ser. No. 08/656,498 filed May 31, 1996 in the name of Kirk A. Martin. This application also relates to U.S. Ser. No. 08/752,127 filed Nov. 20, 1996 in the name of Martin L. Winsemius and Richard A. Kanishak, having a common assignee, the disclosure of which is incorporated herein by reference.

FIELD OF THE INVENTION

The present invention relates to an apparatus and method for applying and pumping an etchant to a plastic encapsulated device, particularly to an epoxy encased semiconductor chip, to provide access to the device or chip for internal visual inspection, test and repair.

BACKGROUND OF THE INVENTION

Plastic packaging of various electronic devices including semiconductor chips have been employed for some years. Typical an epoxy resin is molded around the chip, a central portion of a lead frame and bonding wires or other connections between contact pads on the chip to inner lead fingers on the lead frame. It is often desirous to decapsulate the package at least in part to allow for inspection, test and repair of the chip and the wire bonds to the chip and inner lead fingers, after the epoxy covering these elements is safely and effectively removed.

Commonly, concentrated acids such as sulfuric and nitric acids or other solvents for the resin have been employed. Problems in prior art decapsulators and methods include difficulty in controlling the desired amount of etching, in removing debris formed in the etching process, prevention of damage to the package including interior metallization and providing for adequate safety.

An early patent in the decapsulator art is Wensink U.S. Pat. No. 4,344,809 where a jet etch apparatus includes an etching block and a jet pump provides for etchant flow.

A Decapsulator sold by B&G Enterprises, Inc. of Soquel, Calif., namely a Model 250, includes an appropriate acid resistant gasket seated on an etch head and the device to be decapsulated is placed on the gasket. A safety cover closes automatically when the process is started, clamping the device in place. The gasket on the etch head allows the chamber to be sealed and pressurized with nitrogen to approximately two PSI. The etching is started when a metering pump moves etchant from a heat exchanger located in plate with a sinuous passage into a cavity formed by the gasket, the device and the etch head. The acid remains in the chamber for a short period of time, where it reacts with or attacks the encapsulant material. After the etchant has been allowed to work, the pump is activated again and a fresh volume of acid is moved into the cavity. This process continues until the desired amount of device exposure is achieved. When the integrated circuit is exposed at the end of the etch cycle, the pump runs continuously to flush the cavity. After this rinsing period the entire system is purged with nitrogen, blowing all waste materials into the waste bottle. At the end of the process, the safety cover opens automatically and the device is removed for post-etch cleaning.

U.S. Pat. No. 5,252,179 discloses a method and apparatus for selective spray etching of an epoxy encapsulated chip. A diaphragm can be raised or lowered to direct flow of etchant, and debris is removed without moving the chip from the chip carrier. Used etchant is collected and recycled. U.S. Pat. No. 5,127,991 shows a process for an etching copper sheets in which a pumped source of etchant is heated. U.S. Pat. No. 5,271,798 shows an etching process for tungsten residue on a semiconductor wafer including a sealed apparatus with an etchant inlet port and suction removal of etching byproduct.

In at least some of the prior art devices various deficiencies have been encountered. For example, a fixed etch head is provided which limits the area of the package which is to be etchant attacked; external auxiliary heaters must be used to heat the etchant; excessive etchant fume or seepage limit seal life; there is inefficient removal of etching debris; a particular slowness of the etching process is present due to non-reactive materials at the etch face; and there is a lack of keeping acid consumption low.

SUMMARY OF THE INVENTION

The present invention relates to an apparatus and method for decapsulation of a packaged electronic device where an oscillatory, agitating flow of etchant is provided in an etching cavity for removal of non-reactive elements of the epoxy resin from the etch face resulting in the exposure of more of the reactive material for faster etching. The effect reduces the etch time, the total cycle time due to reduced line fill time and a shorter etchant heat time, while keeping acid consumption low. In one embodiment an interchangeable etch head is provided which allows easy substitutions of etching area styles, that is the size and shape of the package area on which the etchant will attack and etch away the resin. The reduced etchant heat time is accomplished by providing an alumina ceramic heat exchanger block, with an acid inlet port, a waste outlet port and an alumina ceramic, grooved cylinder heat exchanger or multiple holed alumina block in flow connection to the inlet port, and a surrounding aluminum heater block containing at least one resistance heater. Thus only a relative small volume of etchant need be heated immediately prior to the flow of the etchant against the package, lessening the overall decapsulating time.

The apparatus for selectively etching an encapsulant forming a package around an electronic device includes a source of etchant solution; an etching assembly including an etch plate and a movable cover, the etch plate and cover forming an etching chamber; and an etch head supported by the etch plate. An electronic device package to be decapsulated is mounted in the chamber on the etch head. A first pump is provided for pumping a first quantity of etchant solution into the etch head and a second pump provided for agitating the first quantity of etchant solution into and out of an etched cavity formed on an exterior surface of the electronic device package. Debris from the etching of the package is forced through a waste outlet extending from the etch head to a waste reservoir. In a preferred embodiment, the first pump and the second pump are syringe pumps.

In another embodiment an apparatus for selectively etching an encapsulant forming a package around an electronic device includes a source of etchant solution; an etching assembly including an etch plate and a movable cover, the etch plate and cover forming an etching chamber; and an etch head supported by the etch plate. An electronic device package to be decapsulated is mounted in the chamber on said etch head. The etch head includes a demountable cylindrical plug, O-ring sealed in the etch plate, the plug having a passageway extending through the plug in flow connection to the source of etchant solution. The electronic device package is mounted on a surface of the plug facing the etching chamber.

In still another embodiment a diaphragm displacement pump is provided which is substituted for the first and second syringe pumps of the previous embodiment. The inlet valves of the pump are contained preferably in a two-valve manifold that connects a displacement chamber of the displacement pump to either a source of etchant solution, such as an acid bottle, or to a source of low pressure nitrogen. The diaphragm pump functions to draw a fixed volume of etchant into the pump and then into the plumbing between the pump and an etch head. After the acid inlet (and nitrogen inlet valves) are closed the displacement diaphragm cycles between the full IN and OUT positions generating a continuous forward and reverse agitating flow (oscillatory) of etching solution across the etched face of the package being etched, to produce more even etching and removal of etching debris.

The diaphragm pump is made up of a displacement device, the isolation valve and the acid and nitrogen valves. The displacement device is a cylindrical chamber closed on the top by a flexible diaphragm. The cylinder is ported on opposite sides to allow for entry and exit of the pumped material. The flexible diaphragm is held in its up position by a spring loaded secondary flexible diaphragm that is mechanically connected to the main diaphragm. The diaphragm is connected to a pneumatic actuator that, when activated, forces the diaphragm into the cylinder thereby reducing the cylinders volume as compared to the inactivated volume. To pump etchant the diaphragm on the displacement device is placed in the minimum volume position and the isolation valve is closed. The acid valve is then opened and the displacement device is deactivated. As the volume of the displacement cylinder increases, etchant is drawn through the acid valve into the displacement cylinder, the acid valve is then closed and the isolation valve opened. The displacement device is then activated reducing the volume of the displacement cylinder and forcing the cylinder contents through the isolation valve and toward the etch head. During the etch process, the etchant solution is agitated by alternately activating and deactivating the displacement device. The displacement device is changed from activation to deactivation every second. This creates an effective flow rate of about 20 ml/min. Periodically, the agitation is stopped and a new volume of acid is pumped as described above.

At the end of the etch cycle, the acid lines from the pump through the heat exchanger and etch head are first cleared by pumping nitrogen. This is done as above except the nitrogen valve is substituted for the acid valve. After the heat exchanger has been cleared by pumping nitrogen, both the isolation valve and the nitrogen valve are opened allowing the nitrogen pressure to force all remaining etchant and etch debris into the waste reservoir. After all lines are clear, the nitrogen valve is closed and the safety cover opened for the etched device to be removed.

In an additional embodiment an improved etch head and etch head mounting is provided where a two-part etch head is provided including an adapter plate into which acid feed tubes from a heat exchanger and a variety of waste tubes are sealed.

DETAILED DESCRIPTION

Figure 1:
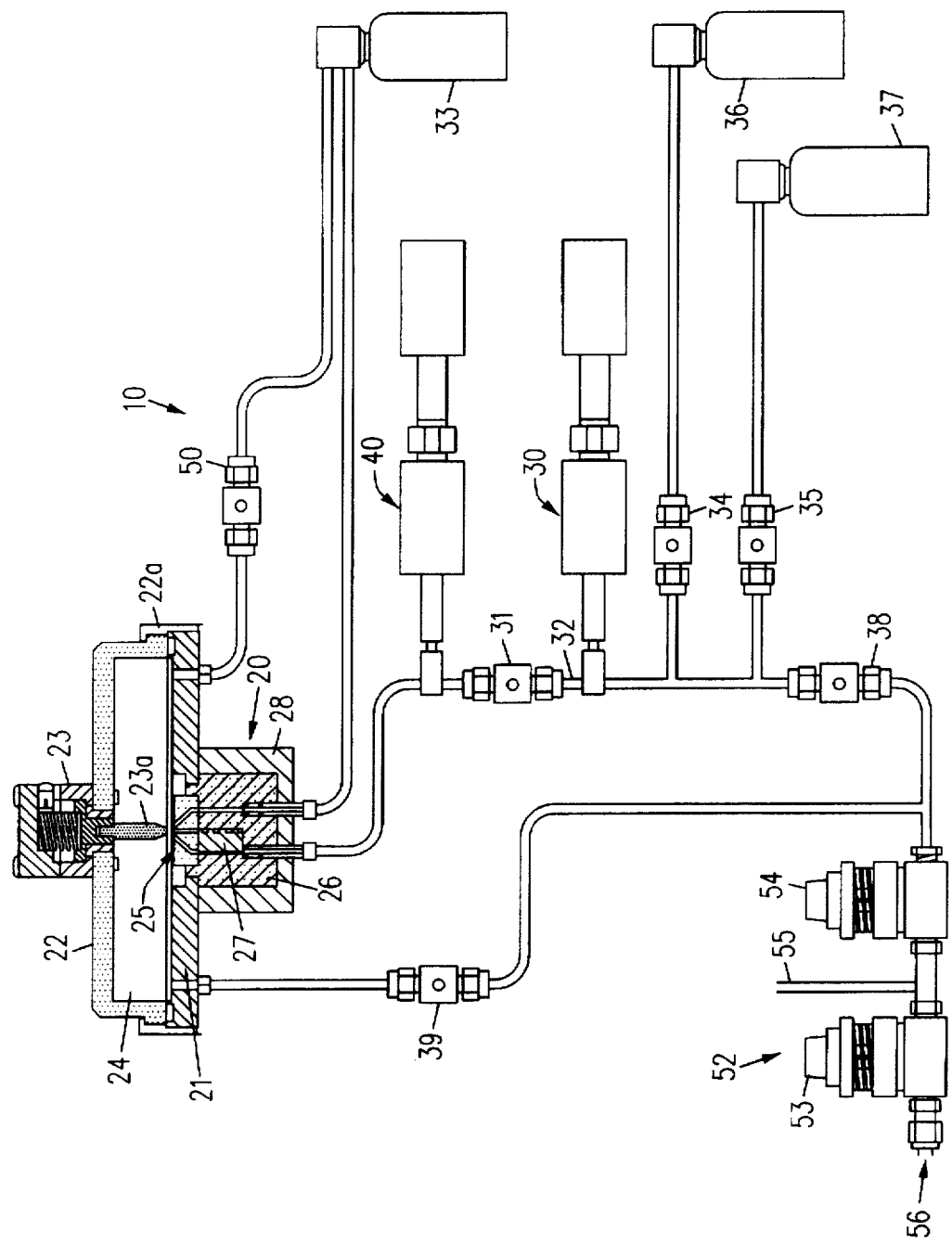
FIG. 1 is a schematic side view partially in section of the overall encapsulation apparatus.

FIG. 1 shows a decapsulating system 10 including an etch head assembly 20 including an etch plate 21, and movable cover 22 clamped on by clamps 22a or otherwise pivoted by structure (not shown) to the etch plate. A spring pressed holder 23 with a ram nose 23a holds the electronic device package 3 (FIG. 3) to be decapsulated against an etch head top surface 25a and gasket or seal 5. The etch head 25 includes an etchant solution inlet passage 11 and waste outlet passages 12 (FIG. 3) leading to a waste bore 15 in a heat exchanger block 26. Block 26 abuts the bottom of the etch head 25 and includes a heat exchanger core 27 having a spirally grooved exterior forming with the walls of a bore 14 in block 26 a spiral passageway 17 for heating etchant solution flowing through the passageway. A heater block 28 including one or more resistance heaters 29 (FIG. 6), concentrically surrounds the cylindrical periphery of heat exchanger block 26. The passageway 17 extends spirally in parallel to the longitudinal axis 8 of block 26 and etch head 25.

Figure 3:
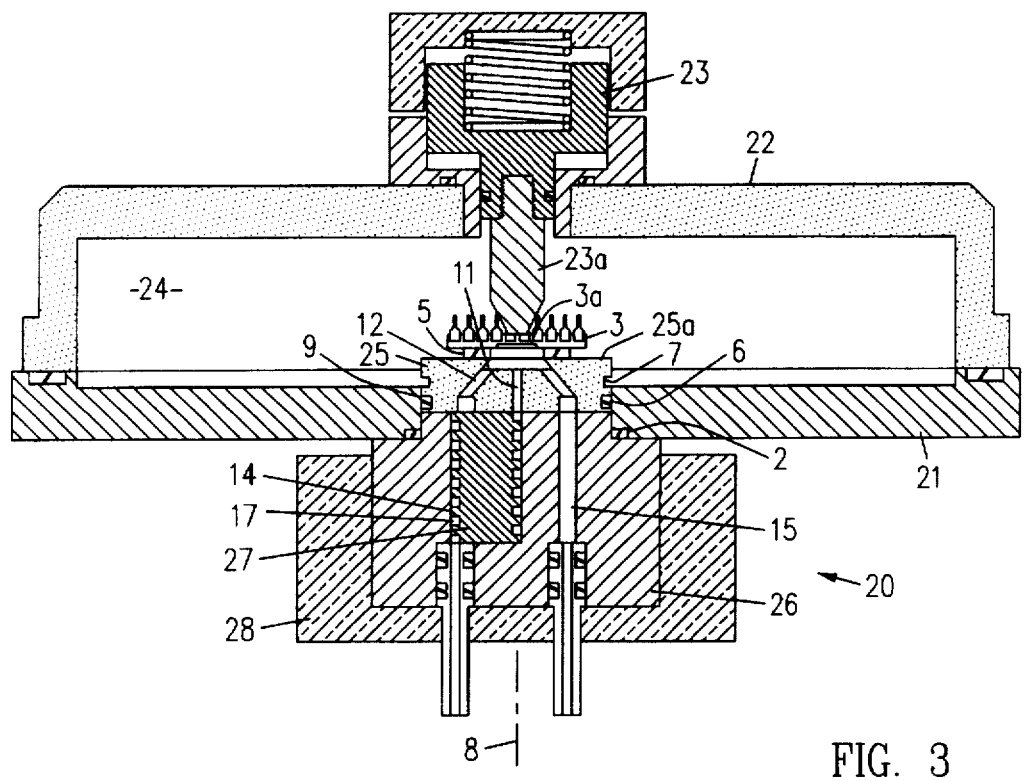
FIG. 3 is a cross-sectional view of the etch head assembly with an integrated circuit chip mounted on the etch head for decapsulation.
Figure 4:
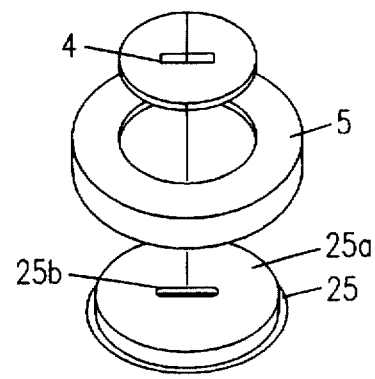
FIG. 4 is an exploded perspective view of the etch head mount for the encapsulated device.

In one embodiment as shown in FIG. 3 the etch head 25 is in press-fitted engagement within a bore 9 in etch plate 21. The etch head contains a cylindrical peripheral groove and O-ring 6 which seals the etch head in the etch plate. A second O-ring 2 seals heat exchanger block 26 in bore 9. A second cylindrical groove 7 extending in a plane above the plane of the etch plate, functions as a finger-grasping groove for manually and easily removing the etch head from bore 9 for replacement, when desired, with an etch head having a different size or shape of exit orifice. For example a cross-shaped orifice can be used to better reach the corners of a rectangular package interior with the agitating stream of acid. FIG. 4 illustrates the top 25a of the etch head 25 with a straight etch orifice 25b therein. A gasket alignment ring 5 and a cavity definition etch disk or gasket 4, as used in the Model 250 Decapsulator is employed for mounting the device 3.

Figure 2:
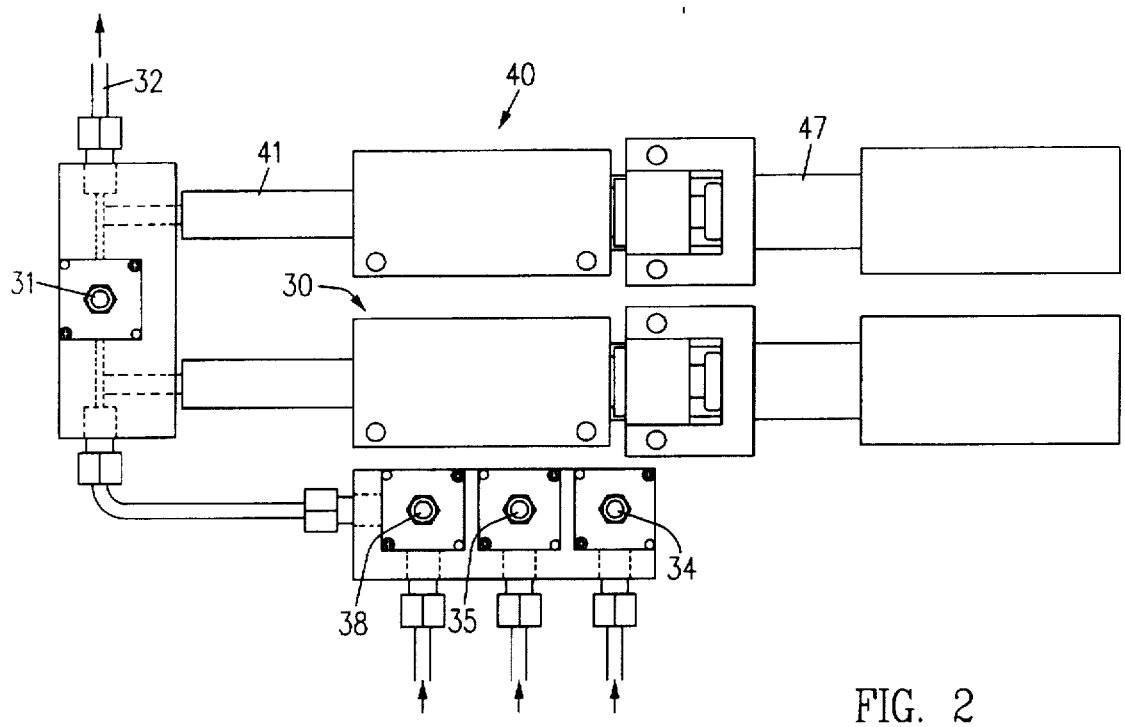
FIG. 2 is a top view of the two-pump subsystem and etchant solution valving.

Referring back to FIGS. 1 and 2, a first acid-resistant syringe pump 30 operates as a positive displacement pump utilizing a standard syringe as the displacement cylinder and piston. The syringe is connected to a first flow valve 31 in a flow line 32 which extends to the heat exchanger block 26.

To eliminate any problems resulting from non-pulsing flow, a second acid-resistant syringe pump 40 is positioned upstream of valve 31 and in connection to flow line 32 to introduce an oscillating flow of etchant solution. This pump 40 will, during the etching portion of the process, keep moving acid into and out of an etched cavity 3a being continually formed on the package exterior which is exposed to the etchant or digester of the package encapsulant and which action eventually provides the desired cavity in the package. This will create an effective flow rate of about 24 to about 30 milliliter\minute, for example, sixty times the volume of the agitator syringe when the syringe is cycled once per second. The effective flow rate is high enough to remove all etch debris and gas from the cavity formed by the etching. Once the volume in flow line 32 fills the passageways in the heat exchanger block, the additional increments of acid introduced by pump 30 carry the resultant debris from the etching zone (cavity) to a waste reservoir 33, such as a waste bottle.

The agitator syringe 40, with valve 31 shut closed, will create effective flow rates and agitation against the package being decapsulated, while keeping acid consumption low. The agitator syringe preferably will swish back and forth a smaller volume, for example ½ milliliter, than the main pump syringe 30 increment(s) which, for example, will inject 2.5 ml. of etchant solution. Both of these syringes normally have a limited plunger life but are easy and inexpensive to service. Any seepage around the plunger is controllable to a workable level. The fixed volume of the main syringe 30 injection will be no problem since the addition of acid increments and the action of the agitator syringe 40 produces the necessary flow to remove debris. On packages that etch very slowly, the flow rate can be reduced accordingly. In typical use there should be no situation where more than 10 ml. of acid is required.

The maintenance cycle for the system will be limited by the operational life of the syringe plungers and the pneumatic air cylinder O-rings. All of the wear related parts are made to allow easy replacement during the periodic maintenance procedure. The overall system life will be determined by the control valve diaphragms and spring life.

Second and third valves 34 and 35 are in flow connection with flow line 32 and to respective sources 36 and 37 of etchant solution, such as sulfuric acid or nitric acid, in particular fuming nitric acid, respectively.

A fourth valve 38 in flow line 32 is connected to a nitrogen gas or other inert gas supply 56 as shown in a prior art gas sub-system 52 to supply inert gas for conveying debris to waste as needed and for supplying initial pressurization inert gas through a fifth valve 39 to a chamber 24 between the etch plate 21 and cover 22. A sixth valve 50 is openable to purge the chamber of initial oxidizing gas or air and of any etching debris occasioned by leakage past the held device 30 into chamber 24. Valve 50 allows venting of chamber 24 to waste reservoir 33 for disposal. A standard high pressure regulator 53 and a standard low pressure regulator 54, as used in the prior art Model 250 decapsulator, supplies debris purging gas. About 40 psi of nitrogen gas is supplied by line 55 to operate the pneumatic controls (not shown) for the various valves.

To effectively transport etch debris and create a clean cavity, a flow rate of 25 to 30 ml per minute of acid is required. To establish a 30 ml per minute flow rate from the agitator syringe, with a 2 second full cycle time, requires a 0.5 ml agitator syringe. A 0.5 ml agitator syringe requires a heat exchanger core with at least 1 ml total volume to keep the agitated volume heated while bringing the next increment of pumped etchant from pump 30 up to temperature in the range of 70°–240° C. depending on the acid used and other process parameters. In addition, the waste side of the etch head assembly preferably has a heated volume of at least 0.5 ml. Since the pump syringe 30 is isolated from the agitator syringe 40 by a valve 31, it need only have the displacement required to fill the system from the syringe to the device package. With the valve 31 isolated, the pump 30 can be drawing in acid from a source bottle 36 or 37 while the agitator syringe 40 is agitating the active volume of acid.

The etch process proceeds as follows

1. The syringe pump 30 draws in a full volume from the acid source bottle. The agitator syringe 40 is at zero volume and all lines are clear of acid.
2. The syringe pump 30 fills the lines 32 from valve 31 to the heat exchange block and in the etch head up to the device package surface abutting the etch head.
3. After the acid heats to etching temperature in the heat exchange core passageway 17, the syringe pump 30 moves an additional 0.5 ml (the volume of the agitator syringe) into the system.
4. With valve 31 closed the agitator syringe 40 is activated drawing in its full volume from the heat exchanger block in one second and returning the "agitating" volume in the next second. These cycles continue typically for 5–20 cycles until the acid reaches its carry capacity. "Carry capacity" as used herein means the amount of debris that the acid can contain and still allow flow of the resultant slurry, without plugging of the various flow passages.
5. The agitator syringe 40 is returned to the zero volume position and the syringe pump 30 moves another 0.5 ml of acid into the system.
6. Steps 4 and 5 are repeated as required. Typically about 16 cycles are needed to effect movement of waste acid to the waste bottle 33. If the syringe pump 30 volume is exceeded, it will draw more acid from the source bottle during the agitation portion of the cycle. During the last agitation cycle, the syringe pump 30 draws a rinse volume from the source bottle.
7. After the device is fully etched to form a decapsulated aperture 3a (FIG. 3) in the device package and exposure of the wire bonds, for example, the agitator syringe 40 returns to the zero volume position and the syringe pump 30 moves the rinse volume into the system. At the end of the rinse pumping cycle, both pump valves 31 and 38 are opened and the entire system is cleared of acid with dry nitrogen from the $N_2$ system 52. Valves 39 and 50 may also be opened to allow flushing of the chamber 24 with nitrogen. It is desired that chamber 24 be an inert environment with no oxygen or water vapor present. Some residual acid will be left in the syringes and valve dead volumes. This may require an acid flush cycle when changing from one acid to the other.

Etching small devices may require only one agitation cycle and the time of the cycle needs to be programmable to control the total etch time. The minimum acid used to etch a part is determined by the fill volume, the agitation syringe displacement, and the minimum rinse volume. The maximum acid consumed is simply a function of the carry capacity of the acid and the volume of material to be removed. Etching low etch rate plastics requires more time, not more acid as the agitation cycle time can be increased to insure complete use of the acid.

The increased agitation in the etched cavity will reduce the total etch time required, particularly for large devices. The constant movement of acid into and out of the etched cavity will be more efficient at removing non-reactive materials, e.g. carbon or glass particles in the plastic encapsulant, from the etched face exposing more reactive material for etching. Even if this does not reduce the etch time for normal devices and plastics, the total cycle time will be reduced because of the reduced fill time and the elimination of any device heat up time. As the acid is heated both in the heat exchanger and the waste tube, the agitation will efficiently transfer heat to the device. This will allow for faster heating than some current etchers where the heat up time currently is determined by the thermal conductivity of the gasket. Using the acid as the heat transfer medium will require that the first agitation cycle be increased in time as there will be little etching until the acid has heated the device up to the etch temperature. In the prior art Model 250, the minimum heat up time is 50 seconds. Twelve seconds of this is required to lower the safety cover and purge and pressurize the chamber. The remainder of the heat up time is required to fill the heat exchanger, heat the acid, and preheat the device being etched. With the syringe system of this invention, the fill time will be one to two seconds, the acid heat time will be about six seconds, and then agitation can be started. This will reduce the total cycle time by thirty seconds down to about 20 seconds.

Figure 5:
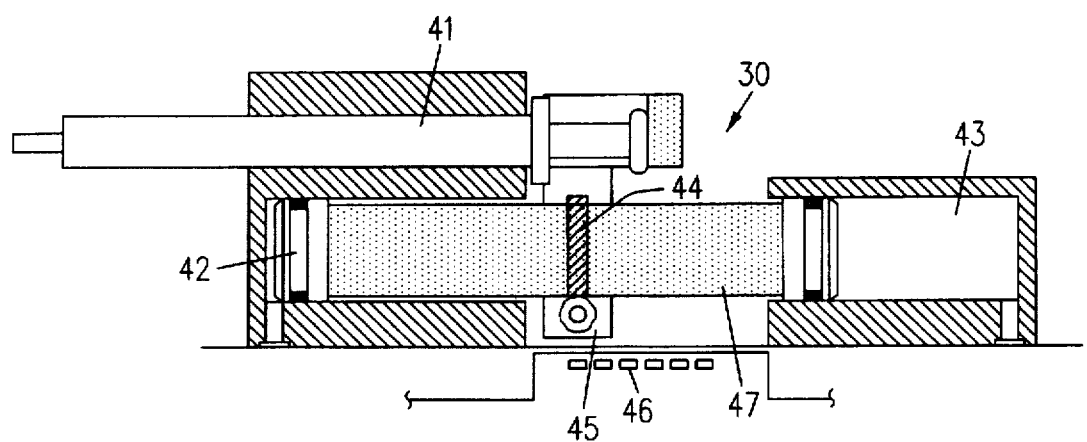
FIG. 5 is a cross sectional view of the agitation syringe with associated metering sensors.

Some of the control functions for the syringe pump 30 and agitator syringe 40 lend themselves well to local control. The agitator syringe with its two position sensor needs to run at its own rate as determined by the exhaust relief valves on a pneumatic control. The pump syringe stroke in pump 30 is controlled to draw and discharge fixed amounts of acid as determined by a minimum of six position Hall-sensors 46 as seen in FIG. 5. Two spaced Hall-sensors may be used to determine the fixed stroke of the agitation syringe 40, particularly that the agitation syringe is operating at its proper stoke. Fiber-optic sensors (not shown) may also be utilized. The activity of the pump syringe 30 preferably is synchronized with the operation of the agitator syringe 40. A small local processor, such an a PIC 16C55 processor available from Microchip Technologies of Chandler, Ariz., as is known in the art is used to control the pump and agitator functions. The control electronics are distributed between the multi-controller and the processor in the etcher unit. The multi-controller provides the user interface and the supervisory control of the etcher unit. A temperature control sub-processor (not shown) measures the output of the thermocouple-type resistor, ambient temperature, line voltage, and current into the heaters. It adjusts the current into heaters based on the difference between the desired temperature of the heat exchanger and the actual temperature thereby controlling the heat exchanger temperature. A multi-controller (not shown) is used to send commands to the local processors and the local processor performs the actual pump and temperature control.

Etchant selection, safety equipment for the operator, unit set-up details of a typically used controller modified for use with the dual syringes of the invention, and general mechanical and electrical operations of a typical decapsulator are in the Model 250 operation, installation and service manual, the content of which are incorporated herein by reference.

The pump assembly includes the syringe pump 30, the agitator syringe 40, acid selection valves, and the associated fittings and plumbing. The assembly is mounted on a plate that will separate the acid from the clean side of the etcher unit. Only pneumatic control lines will pass through the plate and no electronics will be mounted on the acid side. All components, other than springs, screws, and syringe plunger shafts, will be made of Teflon®, glass, polypropylene, or PVC or other acid-resistant material. All metal components, where possible, are made of stainless steel.

As shown in FIG. 5 the syringe 41 per se is driven by two separate air cylinders 42 and 43. Nitrogen is fed into the feed cylinder 42 drawing fluid into the syringe 41. The return cylinder 43 is pressurized to force fluid from the syringe. A magnet 44 is placed in a rod clamp 45 to activate Hall-effect position sensors 46. The control pressure to the cylinders is fed from the mounting face eliminating plumbing from the acid side. A piston 47 made of Teflon plastic because of its wear resistance and natural lubricity extends between the cylinders. All other components, other than the syringe, are made of PVC because of its strength and acid resistance. Two syringe pumps and two manifold valve assemblies make up the complete pump assembly. A three valve manifold provides acid and nitrogen selection. All three valves are normally closed and pneumatically activated. All manifold ports are the standard ¼-28 thread. The second manifold contains only normally closed valve and interconnects syringe Luhr fittings (not shown) with the inlet and outlet.

Acid flow is in direct contact with the heat exchanger. The heat exchanger core 27 is a spirally grooved (on the outside) cylinder that is in press-fitted connection in the heat exchanger block 26. The acid flows through the passageway 17 from the inlet fitting to the etch head. Because the acid is in direct contact with the heat exchanger and block, it heats up very fast requiring only a small acid volume in the heat exchanger core. The heat exchanger core and the heat exchanger block both are made of 99.8% alumina ceramic, allowing for both high thermal conductivity and acid resistance. The heat exchanger is removable for cleaning after the etch head has been removed.

Figure 6:
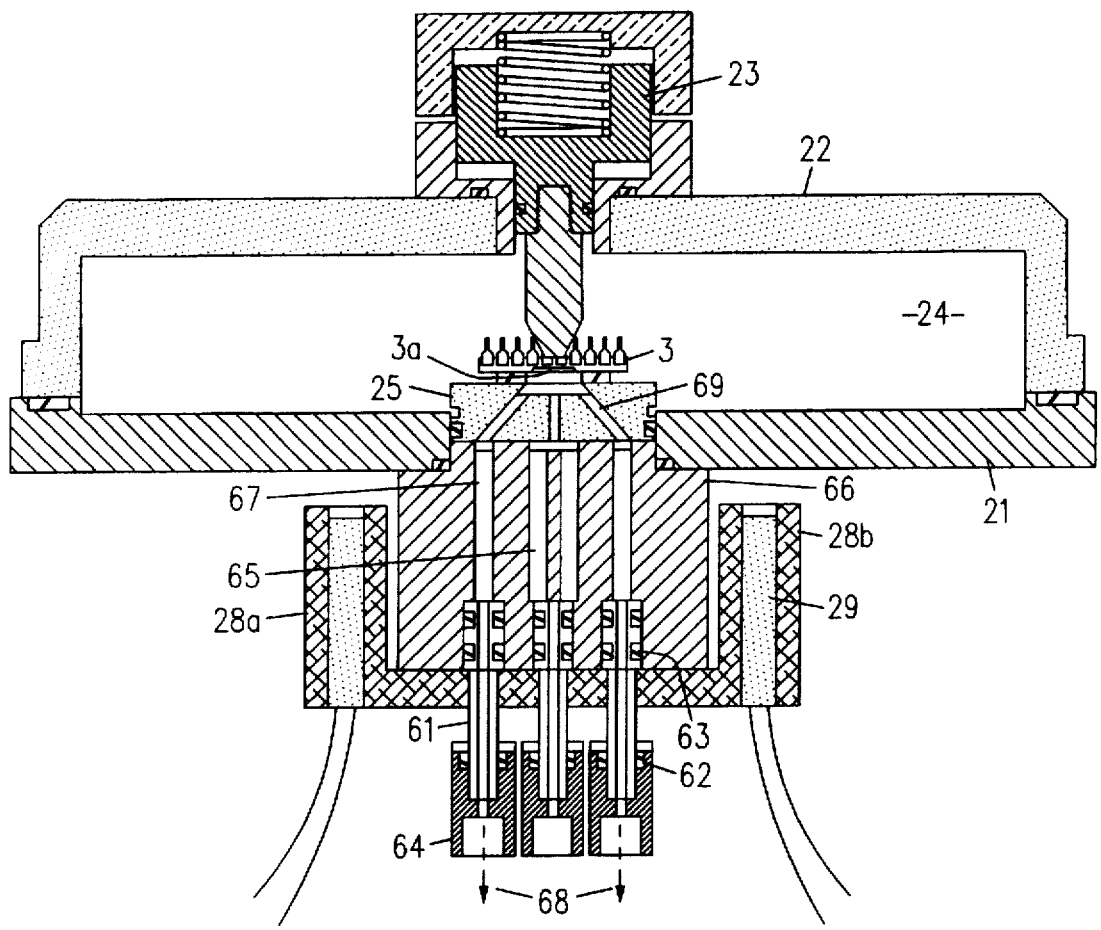
FIG. 6 is a cross-sectional view of a modified form of the etch head assembly including the heater blocks and the heat exchanger block.
Figure 7:
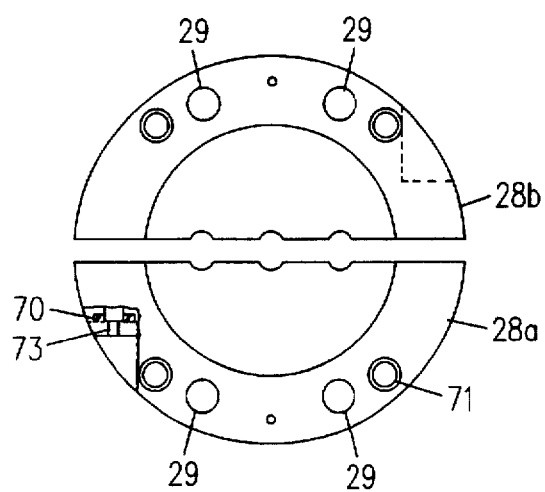
FIG. 7 is a partially cut-away end view of the heater blocks.

As seen in FIG. 6 and FIG. 7 the heat exchanger block 66 is clamped between two heater blocks 28a and 28b in another embodiment of the heater block and heat exchanger block in FIG. 6. The heater blocks 28a and 28b each contain a cartridge heater 29. The heater blocks are made of aluminum. The heater blocks are bolted together and spring loaded by Belleville washers 70 or the like to maintain contact of the heater blocks with the ceramic heat exchanger block, while being allowed to expand when heated. For clarity purposes a gap is shown at this interface between the heat exchanger block and the heater blocks. Bolts 73 secure the heater blocks and holes 71 are provided to bolt the entire assembly to the etch plate. These bolts may be threaded into O-ring sealed nuts (not shown) that pass through the etch plate. The inlet and outlet ports are ceramic tubes 61, sealed by O-rings 63 into the heat exchanger block 66 and secured by the heater blocks 28a and 28b. These tubes allow for some thermal isolation so that standard Teflon transition fittings can be used to attach tube couplings 64 and O-rings 62 and Teflon tubing used in the remainder of the unit. All O-rings are Kelrez® material for its temperature range and acid resistance. In this embodiment the acid is conveyed through a central annulus, a set of four circular holes forming an inlet 65, and waste acid with etching debris conveyed away from the cavity 3a in the chip 3, through slightly modified etch head passages 69 and through outlet circular holes 67 in the heat exchanger 66 to waste (arrows 68).

Figure 8:
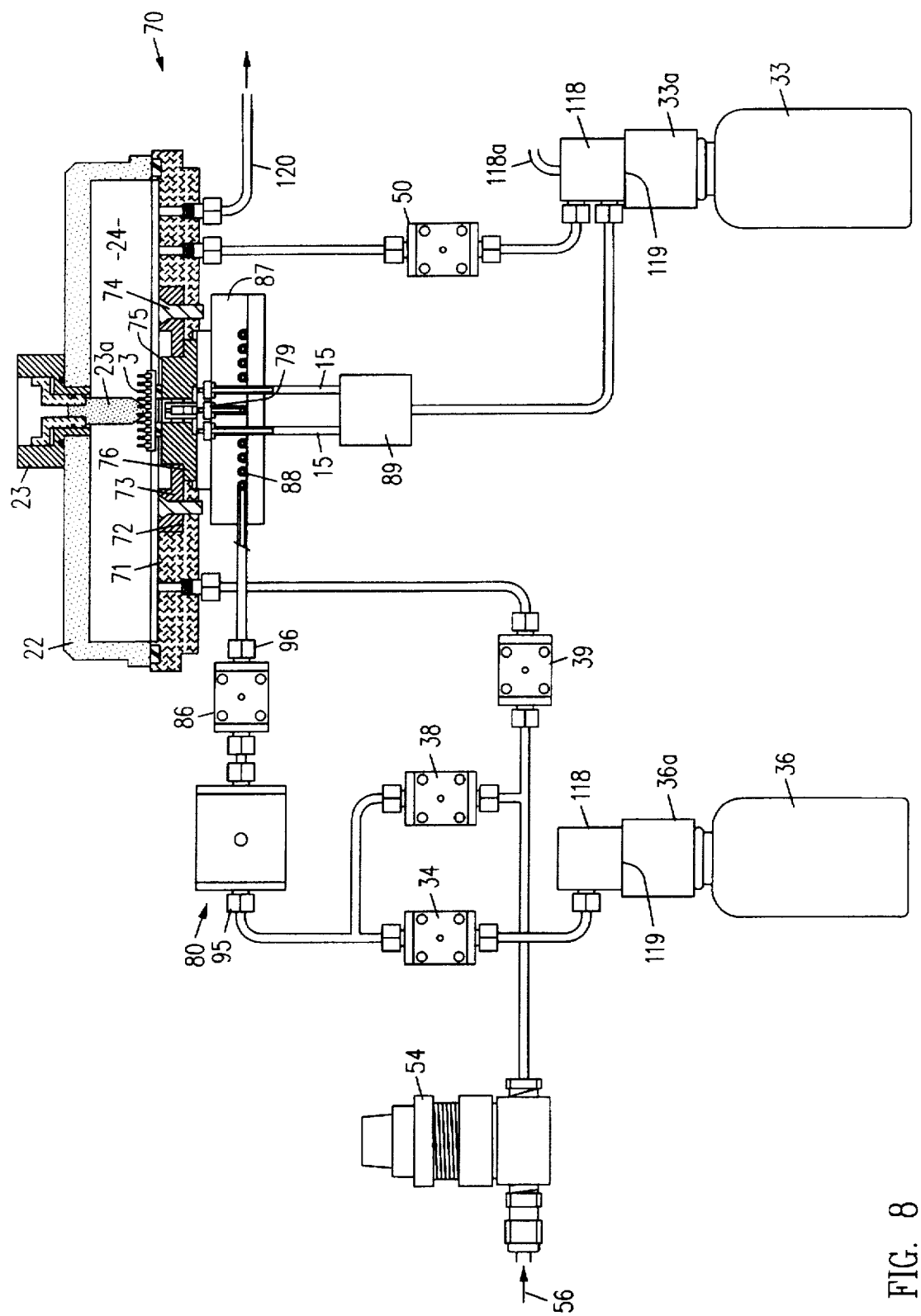
FIG. 8 is a schematic side view partially in section of the displacement pump embodiment of the invention.

FIG. 8 shows a second embodiment of a system for pumping a supply of etchant into an etch head and for agitating the etchant as the etchant progressively etches away a sidewall of a plastic packaged electronic device. Those parts of the system which are common to the parts shown in FIG. 1 have been designated by the same number designation.

The general operation of the system shown in FIG. 8 is as follows:

After an appropriate acid resistant gasket is seated on the etch head, the device to be decapsulated is placed on the gasket. The safety cover closes automatically when the process is started, clamping the device in place and sealing the device in a pressurized chamber. The chamber is purged and then pressurized to about two PSI with nitrogen allowing the etching to take place in an oxygen and water vapor free environment as the device is being heated to optimum etch temperature, the acid pump transfers etchant from the acid storage bottle to the heat exchanger for heating to etch temperature. After the device and the acid inside the heat exchanger are at temperature, the decapsulation process is started by the acid pump transferring additional etchant into the heat exchanger forcing the hot etchant into contact with the device. The etchant in contact with the device is agitated to ensure even removal of encapsulant and complete utilization of the etchant. When the etchant in contact with the device is spent, the acid pump transfers additional etchant into the heat exchanger forcing fresh acid into contact with the device. This process is continued until the desired amount of exposure is achieved. At the end of the etch process, the cavity created by the etchant is flushed with clean etchant to remove all etch debris and then the entire system is purged with nitrogen to force the waste materials into the waste bottle. At the end of the purge process, the cover opens automatically and the device is removed for post etch cleaning.

Figure 9:
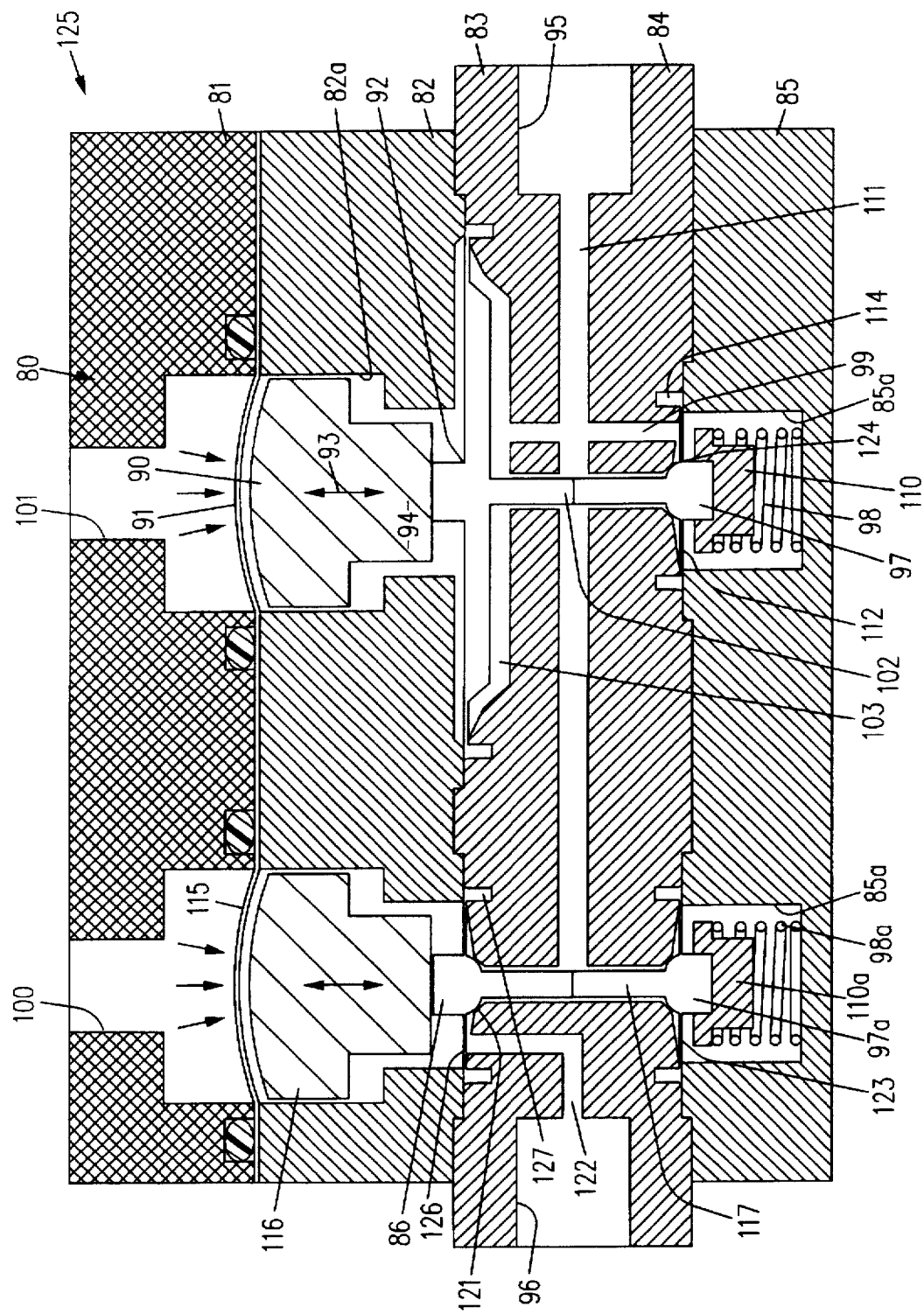
FIG. 9 is a cross-sectional view of the diaphragm displacement pump per se.
Figure 10:
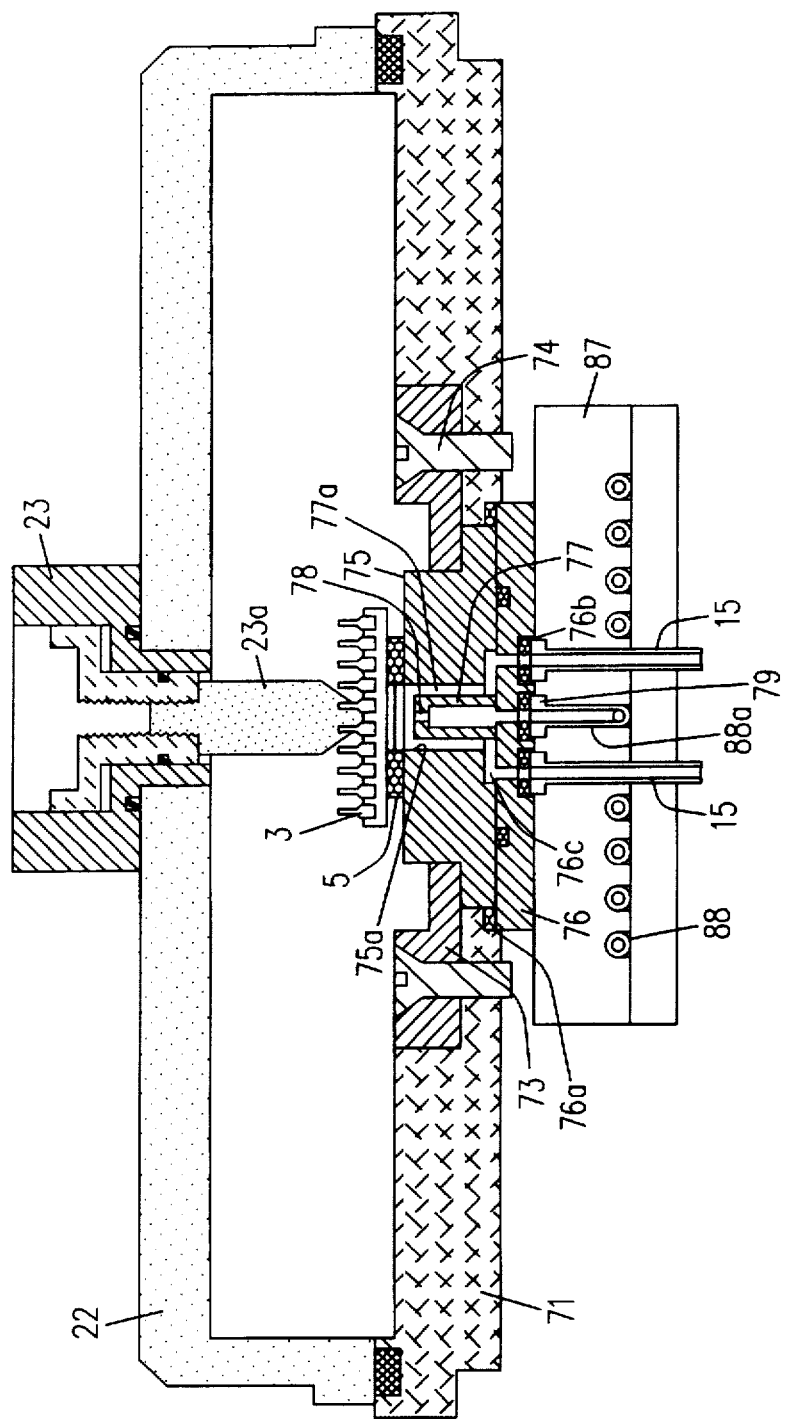
FIG. 10 is magnified cross-sectional view of the etch plate, etch head, cover and heat exchanger.

The FIG. 8 system differs from the system shown in FIG. 1 primarily by the use of a displacement pump device 80 for pumping acid etchant from acid bottle 36 through an acid valve 34, or nitrogen gas from a regulator 54 through a nitrogen valve 38, into a displacement pump inlet 95. The displacement valve includes a displacement chamber 103 (FIG. 9) which pumps a predetermined volume of acid (or N₂) through outlet 96 via a normally open isolating valve 86, which may be a separate discrete valve (FIG. 8) or combined with the displacement pump in one housing (FIG. 9). The acid etchant passes from the isolation valve 86 through flat spiral tubing 88 in a heat exchanger block 87, normally of aluminum, through an "UP" tube 88a (FIG. 10) which is connected to a connector 79 in an adapter, preferably of 99.8%, alumina ceramic, plate 76 extending under an etch head, preferably of 99.8% alumina ceramic, 75 seated in an etch plate 71, preferably of polyvinylchloride and held in place by a Teflon® etch head retainer 73. Heat exchanger block 87 may also contain heaters as in FIG. 6 for heating the acid flowing through the spiral tube 88. A packaged electronic device 3 to be decapsulated is positioned on the etch head and as seen FIGS. 3, 8 and 10 is held in place by a ram nose 23a pressed down by a spring-operated plunger 23 fitted with the top of a Teflon ring sealed safety cover 22. A pressure switch connection 120 extends from the etching chamber 24, the pressure switch (not shown) functioning to determine if the chamber is properly sealed and pressurized prior to etching. The etch head includes passageways which lead from the etching area adjacent to the underside of the package 3 to waste tubes 15, a tube junction block 89 and to waste bottle 33. A Teflon® block 118 and vent 118a in flow connection with block 89 includes a rotary joint 119 with bottle cap 33a so that the cap and bottle can be disconnected for emptying the waste bottle. A similar block 118 and rotary joint 119 are associated with the bottle cap 36a of acid etchant bottle 36.

FIG. 9 shows the details of a combined displacement pump 80 and isolation valve 86. The pump is divided into two different assemblies. The inlet valves 34 and 38 of the pump are contained in a two valve manifold (not shown) similar to the three valve manifold shown in FIG. 2 that connects the displacement chamber 103 of the pump 80 to either the acid bottle 36 or to low pressure nitrogen 56 through regulator 54. The displacement chamber and the pump output valve 86 are contained in a single assembly 125.

The assembly 125 comprises a base 85 having a pair of bores 85a into which return springs 98 and 98a and spring retainers 110 and 110a are placed. A normally square-in-cross section valve piece 83 including a circular inlet bore 95, and a circular outlet bore 96 and an axial passage 111 from inlet 95 to the isolation valve 86. A stem 97 mounts a diaphragm 112, the peripheral edge of which diaphragm is press-fitted into a circular groove 114 in piece 83. Stem 97 is connected to rod 102 which is connected to displacement diaphragm 92 and extends through displacement chamber 103. A piston block 94 extends reciprocally through a bore 82a of an intermediate cylinder member 82 and is reciprocated (double arrow 93) by pneumatic pressure of typically about 45 psi through port 101 from a pressure regulator and electrically operated valves (not shown). The air pressure forces actuation diaphragm 91 downwardly to thus move piston 94 down to provide the pumping and suction strokes of the pump. A pump assembly top member 81 provides a seal and holds the diaphragm 91 in place. A pressure equalization port 99 is provided between the displacement chamber 103 and the stem 97 mounting return diaphragm 112 of the displacement pump 80 so that there is no valve seat formed at 124 and thus no acid etchant is trapped around the return diaphragm. The combined isolation valve 86 also includes a diaphragm 115 and piston 116 which operates with a stem 117 providing a valve seat 121 for operating and closing the passageway 111 and an outlet passageway 122 leading to outlet 96. Spring 98a provides a return force resulting in valve 86 being normally OPEN. A similar diaphragm 126 is connected to stem 117 and is held in a groove 127 in valve piece 83. Similarly, return diaphragm 123 is seated in a groove in lower piece 84 of the valve piece 83.

The suction stroke is started with the pump output valve and both of the inlet valves closed and the displacement diaphragm in its full in position. The cycle is initiated by the opening of the acid inlet valve. The displacement diaphragm is then lifted by the return diaphragm and spring drawing in a fixed volume of acid. The inlet valve is then closed and the output valve opened. The displacement diaphragm is then moved to its full in position by pneumatic pressure through actuation port 101 forcing the acid out through the outlet valve. When the unit is etching a part, the acid is pumped as above at a rate the corresponds to the programmed flow rate.

In between pumping cycles, the inlet valves are left closed, the outlet valve open and the displacement diaphragm is cycled between the full in and out positions by ON and OFF control of the pneumatic actuator (not shown) i.e., the 45 psi pressure. This generates a continuous although reversing oscillatory, agitating flow across the etched face producing complete removal of etch debris and resulting in more even etching. To keep the agitated acid from cooling when it is on the waste side of the device, the etch head assembly should have a contained waste volume that is greater than the pump displacement volume from chamber 103.

FIG. 10 shows the etch head and heat exchanger in more detail. The agitation operation requires that there is a large contained volume of waste in the etch head 75. This allows the build up of etch debris on the inside of the acid passages. This requires that the passages be easily accessible for cleaning. The etch head 75 is made in two parts, the etch head proper and an adapter plate 76. The etch head 75 includes a demountable flanged cylindrical plug, clamped by retainer 73 and four screws 74 into the etch plate 71, the plug having a passageway 75a extending through the plug in flow connection to the source of etchant solution. The etch head is held in contact with the adapter plate and sealed to the plate with an 'O' ring 76a. The heat exchanger 87 and waste tubes 15 are directly sealed to the bottom of the adapter plate by 'O' ring 76b. The bottom of the etch head contains a waste groove 76c that contains the required waste volume. To clean the etch head and waste passages, a Teflon® retaining ring 73 is removed by unscrewing screws 74 and the etch head lifted out. This allows the detailed cleaning of the waste groove and the passages into and out of the etched cavity. The waste groove also allows for the generation of different porting patterns as there is no restriction on the placement and number of the waste ports. Acid etchant from pump 80 is conveyed by tube 88a into a cylinder 77 having an etching orifice 78 from which exiting etchant etches the underside of device package 3. Two or more cylindrical passages 77a convey waste acid and debris to groove 76c and to waste lines 15.

In the embodiment of FIGS. 8–10 a small processor, such as a PIC16C65 available from Microchip Technologies of Chandler, Ariz., is located in the etcher unit enclosure (not shown), provides all user interface, temperature control, and valve sequencing. The control processor controls the front panel display and interfaces to the user through a front panel keyboard. The nitrogen and acid valves may be combined into a single assembly similar to the manifold assembly in FIG. 2.

The above description of the preferred embodiments of this invention is intended to be illustrative and not limiting. Other embodiments of this invention will be obvious to those skilled in the art in view of the above disclosure.

We claim:

1. An apparatus for selectively etching an encapsulant forming a package of resinous material around an electronic device comprising:

a source of etchant solution;

an etching assembly including an etch plate and a movable cover, said etch plate and cover forming an etching chamber;

an etch head supported by said etch plate, wherein an electronic device package is mountable in said chamber on said etch head;

a pump for pumping a quantity of etchant solution into said etch head and for agitating at least part of the quantity of etchant solution into and out of an etched cavity formed on an exterior surface of the electronic device package by reaction of the etchant solution with the resinous material; and a waste outlet extending from said etch head to disposal.

2. The apparatus of claim 1 wherein said pump is a displacement diaphragm pump.

3. The apparatus of claim 2 further comprising an isolation valve between said pump and said etching assembly for controlling flow of etchant solution.

4. The apparatus of claim 3 wherein said isolation valve is included in a common housing with said pump and wherein said housing includes an etchant solution inlet and outlet, and a passageway therebetween and wherein said isolation valve includes a valve seat in said passageway.

5. The apparatus of claim 4 further including a valve between said source and said pump and wherein, when said valve is closed, a portion of the quantity of etchant solution is moved back and forth into and out of said etch head.

6. The apparatus of claim 4 wherein said pump includes a displacement diaphragm forming a displacement chamber with said passageway.

7. The apparatus of claim 6 wherein said isolation valve includes an actuator diaphragm, a piston and a valve stem movable by pneumatic pressure to close said isolation valve and a return spring and return diaphragm for opening said isolation valve upon removal of the pneumatic pressure.

8. The apparatus of claim 6 wherein said pump further includes a pump actuator diaphragm, a pump piston and a pump stem movable by pneumatic pressure to displace said displacement diaphragm in a pumping stroke and a return spring and return diaphragm to return the displacement diaphragm in a suction stroke to an original position.

9. The apparatus of claim 1 wherein said etch head includes a demountable cylindrical plug O-ring sealed in said etch plate, said plug having a passageway extending through said plug in flow connection to said source of etchant solution and wherein the electronic device package is mounted on a surface of said plug facing said etching chamber.

10. The apparatus of claim 9 wherein said etch plate includes a central bore, said cylindrical plug being mounted in said bore and further comprising an adaptor plate underlying said etch head and an etch head retainer overlying a portion of said etch plate and said etch head such that said etch head is removable from said etch plate to allow for cleaning access to said adaptor plate.

11. The apparatus of claim 10 further including an etchant flow connector and a waste outlet connector in said adaptor plate.

12. An apparatus for selectively etching an encapsulant forming a package around an electronic device comprising:

a source of etchant solution;

an etching assembly including an etch plate and a movable cover, said etch plate and cover forming an etching chamber;

an etch head supported by said etch plate, wherein an electronic device package is mounted in said chamber on said etch head; and wherein said etch head includes a cylindrical plug, O-ring sealed in said etch plate and an etch head retainer removably connected to said etch plate and overlying a flange portion of said etch head, said plug being demountable from said etch plate after removal of said retainer in a direction facing said etching chamber, said plug having a passageway extending through said plug in flow connection to said source of etchant solution and wherein the electronic device package is mounted on a surface of said plug facing said etching chamber.

13. The apparatus of claim 12 further comprising an etch cylinder extending into a bore of said cylindrical plug and outwardly facing said etching chamber, said etch cylinder having an orifice for etching away a shaped hole in an exterior surface of the electronic device package.

14. The apparatus of claim 12 further comprising a displacement pump in flow connection between said source of etchant solution and said etch head for moving a volume of etchant solution into and out of said etch head and for agitating said volume cyclically against an exterior of an electronic device package positioned on said etch head.

15. A method of decapsulating a plastic package of resinous material surrounding an encapsulated electronic device comprising:

providing a source of etchant solution and an etching assembly including an etch plate and a movable cover, and an etch head in flow connection to the source of etchant solution;

positioning an electronic device package of resinous material on the etch head;

displacement pumping a volume of etchant solution from the source of etchant solution to the etch head;

displacement oscillating at least a portion of the volume of etchant out of and back into the etch head; and thereby digesting the resinous material to form a hole in said package.

16. An apparatus for selectively etching an encapsulant forming a package of resinous material around an electronic device comprising:

a source of etchant solution;

an etching assembly including an etch plate and a movable cover, said etch plate and cover forming an etching chamber;

an etch head supported by said etch plate, wherein an electronic device package is mountable in said chamber with respect to said etch head;

a pump for pumping a quantity of etchant solution into said etch head and against a sidewall of the package and for agitating at least part of the quantity of etchant solution into and out of an etched cavity formed on the sidewall of the package by reaction of the etchant solution with the resinous material; and a waste outlet extending from said etch head to disposal.

17. The apparatus of claim 16 wherein said pump is a displacement diaphragm pump.

* * * * *